United States Patent [19]
Yamada et al.

[11] Patent Number: 5,926,413
[45] Date of Patent: Jul. 20, 1999

[54] FERROELECTRIC MEMORY DEVICE

[75] Inventors: Junichi Yamada; Hiroki Koike, both of Tokyo, Japan

[73] Assignee: NEC Corporation, Tokyo, Japan

[21] Appl. No.: 09/115,344

[22] Filed: Jul. 15, 1998

[30] Foreign Application Priority Data

Jul. 16, 1997 [JP] Japan ................................ 9-191207

[51] Int. Cl.⁶ ................................................ G11C 11/22
[52] U.S. Cl. ........................... 365/145; 365/205; 365/210
[58] Field of Search ................................ 365/145, 149, 365/210, 205

[56] References Cited

U.S. PATENT DOCUMENTS

| | | | |
|---|---|---|---|
| 5,539,279 | 7/1996 | Takeuchi | 365/145 |
| 5,617,349 | 4/1997 | Koike | 365/145 |
| 5,663,904 | 9/1997 | Arase | 365/145 |
| 5,677,865 | 10/1997 | Seyyedy | 365/145 |
| 5,764,561 | 6/1998 | Nishimura | 365/145 |

*Primary Examiner*—Son Mai
*Attorney, Agent, or Firm*—Sughrue, Mion, Zinn, Macpeak & Seas, PLLC

[57] ABSTRACT

It is an object of the invention to provide a method for generating a reference voltage by means of a sense amplifier in a ferroelectric memory device in a 1T1C type (One Transistor One Capacitor type). The directions of the polarizations of dummy cell DMC1 and DMC2 are set so that they are not inverted in case that data stored therein are read. Transistors T1 and T2 are added to the sense amplifier in order to make it be unbalanced, when a datum stored in a memory cell is read. In case that a datum stored in the memory cell is read, the transistor on the dummy cell side is on and that on the memory cell side is off. Widths of channels of T1 and T2 are selected so that an apparent reference voltage is slightly higher than a voltage read on a bit line in case that the polarization of the dummy cell is not inverted.

4 Claims, 5 Drawing Sheets

FERROELECTRIC MEMORY DEVICE

FIELD OF THE INVENTION

The invention relates to a non-volatile semiconductor memory device, and especially to a ferroelectric memory device using ferroelectric material.

BACKGROUND OF THE INVENTION

In a ferroelectric memory device, a datum stored in a memory cell is read based on a reference voltage generated by a dummy cell in most cases, and earnest efforts have been made in order to improve the characteristics of the dummy cell. However, two disadvantages have been pointed out on the conventional dummy cells.

In the dummy cell comprising a ferroelectric capacitor, in which the direction of the polarization of the ferroelectric capacitor is inverted whenever the reference voltage is generated, the reference voltage becomes uncertain on account of dielectric fatigue of ferroelectric material of the dummy cell, when the reference voltage is generated many times.

In the dummy cell of the other kind, the ferroelectric capacitor in the dummy cell is designed so that its capacitance is different from that of the memory cell. However, according to this method, the method for designing the capacitor size of the ferroelectric capacitor in the dummy cell is too complicated.

As mentioned in the above, it is extremely desirable to develop a dummy cell, in which the polarization of the dummy cell is not inverted in case that the reference voltage is generated, and the ferroelectric capacitor of the dummy cell is the same as that of the memory cell.

SUMMARY OF THE INVENTION

Accordingly, it is an object of the invention to solve problems related to methods for generating a reference voltage, which is necessary for a semiconductor memory device using ferroelectric material of one transistor—one capacitor type, and provide a ferroelectric memory device with a highly reliable read circuit.

According to the feature of the invention, a ferroelectric memory device comprises:

plural memory cells connected with the respective bit lines, each of the memory cells being composed of a ferroelectric capacitor and a MOS transistor, wherein a direction of a polarization of ferroelectric material of the ferroelectric capacitor corresponds to a datum stored in the memory cell, two dummy cells respectively connected with the bit lines, each of the dummy cells having a same structure and a same ferroelectric capacitor as those of the memory cell, wherein a direction of a polarization of ferroelectric material of a ferroelectric capacitor of the dummy cell is set so that it is not inverted in case that a datum stored in the dummy cell is read, and a sense amplifier, which is connected with the bit lines, provided with means for generating offset therein by intentionally making it be unbalanced, and reads the datum stored in the memory cell with reference to a voltage generated by the offset and a signal voltage read from the dummy cell.

BRIEF DESCRIPTION OF THE DRAWING

The invention will be explained in more detail in conjunction with appended drawings, wherein.

DESCRIPTION OF THE PREFERRED EMBODIMENTS

Figure 1:
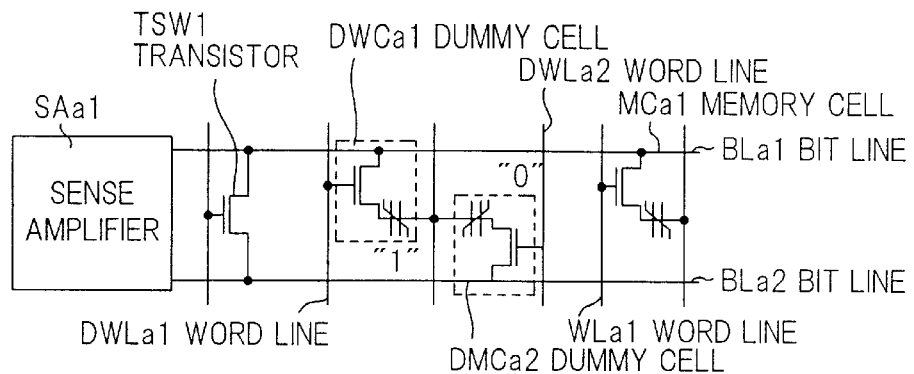
FIG. 1 is a circuit diagram for explaining a conventional method for generating a reference voltage.

Before explaining a ferroelectric memory device in the preferred embodiments according to the invention, the aforementioned conventional ferroelectric memory device will be explained referring to FIGS. 1 to 3.

In a ferroelectric memory device employing a memory cell of one transistor—one capacitor type (a 1T1C—type), it is necessary to generate a reference voltage in order to discriminate whether a datum read from a memory cell is "0" or "1". As one of the methods for generating the reference voltage, a technology using a dummy cell is well known. As methods for constructing the dummy cell, those disclosed on Japanese Patent Kokai 7-192476 and 7-93978 can be enumerated. In these methods, two dummy cells respectively comprising ferroelectric capacitors are set up, and data "1" and "0" are respectively written in both the dummy cells. The reference voltage generated by reading these data and deriving the mean value of them.

The method disclosed in Japanese patent Kokai 7-93978 will be explained referring to FIG. 1. Data "1" and "0" are respectively written in dummy cells DMCa1 and DMCa2. After bit lines BLa1 and BLa2 are pre-charged, dummy cells DMCa1 and DMCa2 are respectively selected by word lines DWLa1 and DWLa2, and thereby signal voltages corresponding to "1" and "0" are respectively generated on bit lines BLa1 and BLa2. Next, a transistor TSW1 is made to be on by a signal for short circuiting the bit lines, and a signal voltage, which is intermediate between those corresponding to "1" and "0", is generated on both the bit lines. Then, TSW1 is made to be off, and the bit line BLa1 is again pre-charged and a datum stored in the memory cell MCa1 is read. In this case, the voltage of the bit line BLa1 corresponds to a datum read from the memory cell MCa1, i.e. "1" and "0", and the voltage of the bit line BLa2 corresponds to a datum intermediate between "1" and "0". In this way, a ferroelectric memory device of a one transistor—one capacitance type an be constructed. Moreover, in a technology disclosed in Japanese Patent Kokai 7-192476, a reference voltage generated by the dummy cell is stored in a memory, and thereafter the reference voltage is not generated by the dummy cell, and thereby, the deterioration of the dummy cell caused by dielectric fatigue of ferroelectric material can be prevented.

As other methods for constructing a dummy cell, technologies disclosed in Japanese Patent Kokai 2-301093 and U.S. Pat. No. 4,873,664 can be enumerated. In these technologies, the size of a ferroelectric capacitor of the dummy cell is different from that of a memory cell, and a reference voltage is generated by such a structure.

The technology disclosed in Japanese patent Kokai 2-301093 will be explained referring to FIG. 2. In this drawing, a memory cell MCa1 is selected by a word line WLa1, and a signal voltage is generated on a bit line BLa1 by driving a plate line PLa1. A dummy cell DMCa1 is selected by a word line DWLa1, and a reference voltage is generated on a bit line BLa2 by driving a plate line DPLa1. The capacitor size of the dummy cell is so selected that it is smaller than that of the memory cell, and the direction of its polarization is so set that the polarization is always inverted, whenever the reference voltage is generated.

Moreover, the capacitance of CFa1 in case that its polarization is not inverted is smaller than the capacitance of DCFa1 in case that its polarization is inverted. As the result, the capacitance of DCFa1 is smaller than that of CFa1 in case that its polarization is inverted, and larger than that of CFa1 in case that its polarization is not inverted. Accordingly, a signal voltage corresponding to a datum intermediate between "1" and "0" can be generated on the bit line BLa2. In the aforementioned example, the capacitor size of the DCFa1 is smaller than that of CFa1, but a similar result can be obtained in case that the capacitor size of DCFa1 is larger than that of CFa1, and the direction of polarization of the dummy cell is set so that it is not inverted in case that the reference voltage is generated, as shown in U.S. Pat. No. 4,873,664.

Moreover, as another technology for constructing a dummy cell, that disclosed in Japanese Patent Kokai 5-114741 can be exemplified. In this technology, a capacitor comprising ordinary dielectric material is used as a dummy cell, and a signal voltage obtained by reading a memory cell is raised by using electric charge stored in the dummy cell so that a pre-charge voltage is equal to a voltage corresponding to an intermediate level between "1" and "0"

This technology will be explained referring to FIG. 3. A voltage VCC/2 is applied between both the electrodes of the memory cell capacitor CFa1 from the outside. Moreover, a memory cell MCa1 is selected by a word line WLa1, and a signal voltage is generated on a bit line BLa1. A dummy cell capacitor DCa1 is selected by a dummy cell word line DWLa1 and the voltage of the bit line BLa1 is raised. When the datum of the memory cell MCa1 is read, first, bit lines BLa1 and BLa2 are pre-charged at the voltage of VCC, then a word line WLa1 is selected, and a datum is read on a bit line. Next, a dummy cell word line DWLa1 is selected, and the voltage of the bit line is raised. In this case, the capacitance of the dummy cell is so selected that, the raised voltage of the bit line is higher than the pre-charge voltage in case that the datum is "1", and lower than the pre-charge voltage in case that the datum is "0" As the result, the datum can be detected by means of a sense amplifier SAa1 using the pre-charge voltage of BLa2 as the reference voltage.

Figure 7:
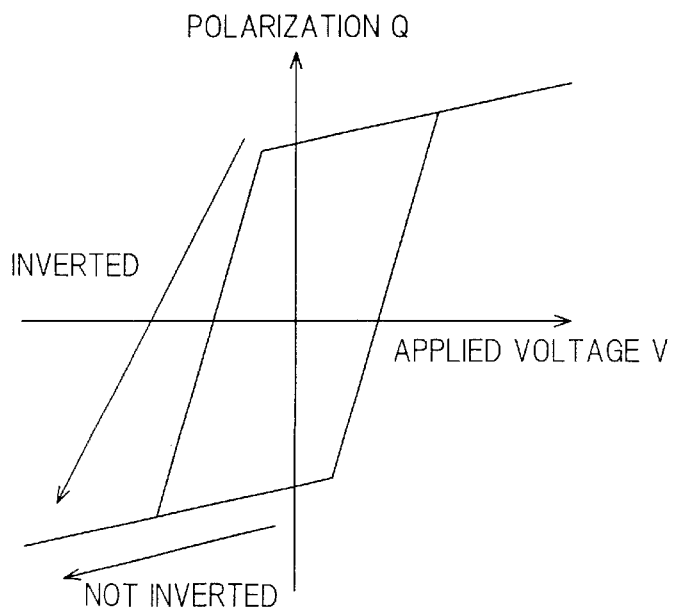
FIG. 7 shows a dielectric hysteresis of ferroelectric material.
Figure 8:
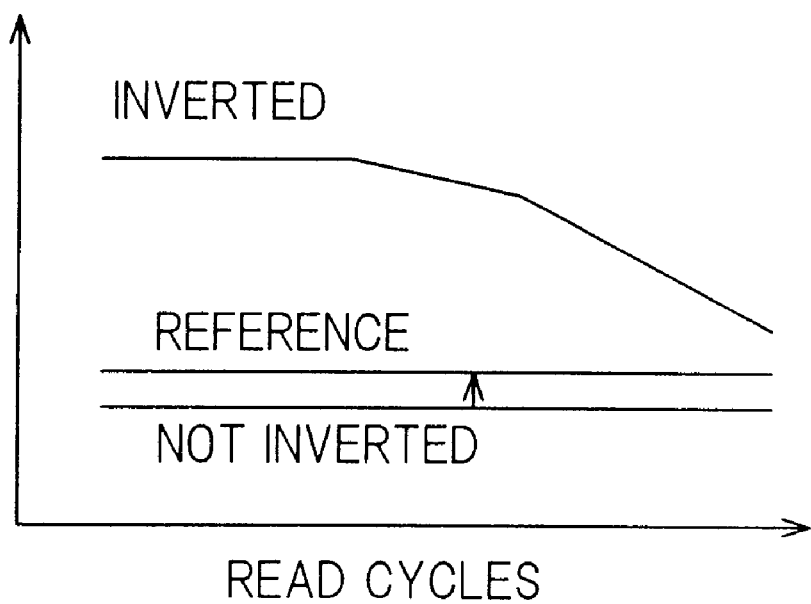
FIG. 8 shows a relation between polarization charge of ferroelectric material and the number of read cycles.

In case that a datum is repeatedly read from a ferroelectric memory element comprising ferroelectric material with dielectric hysteresis characteristic in FIG. 7, it is desirable that a polarization electric charge is constant independently of the number of the times of readings. However, as shown in FIG. 8, in case that the polarization of ferroelectric material is inverted each time the datum is read, the polarization charge decreases as the number of read cycles readings increases on account of dielectric fatigue of ferroelectric material. On the contrary, in case that the polarization is not inverted each time the datum is read, the polarization charge is kept to be almost constant independently of the number of read cycles. By the aforementioned reason, according to the first dummy cell, in which data "1" and "0" are respectively written in two dummy cells and a reference voltage is given as an intermediate level between those read from the two dummy cells, the exact reference voltage cannot be generated after it is used many times, because of the difference in the number of access between the memory cell and the dummy cell. This problem occurs in case of the dummy cell disclosed in Japanese Patent Kokai 7-192476 also.

Figure 2:
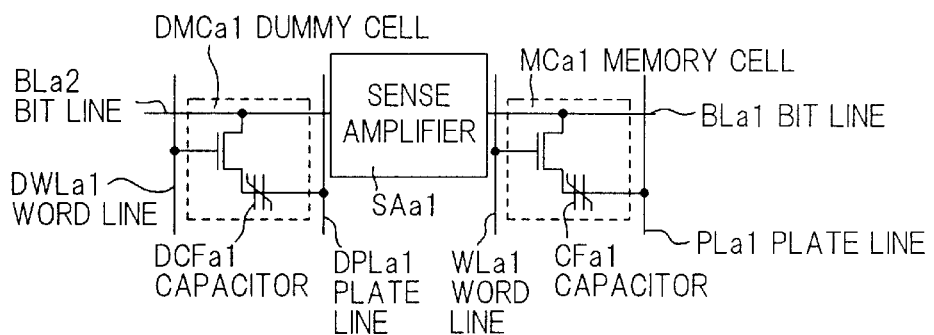
FIG. 2 is a circuit diagram for explaining a conventional method for generating a reference voltage.
Figure 3:
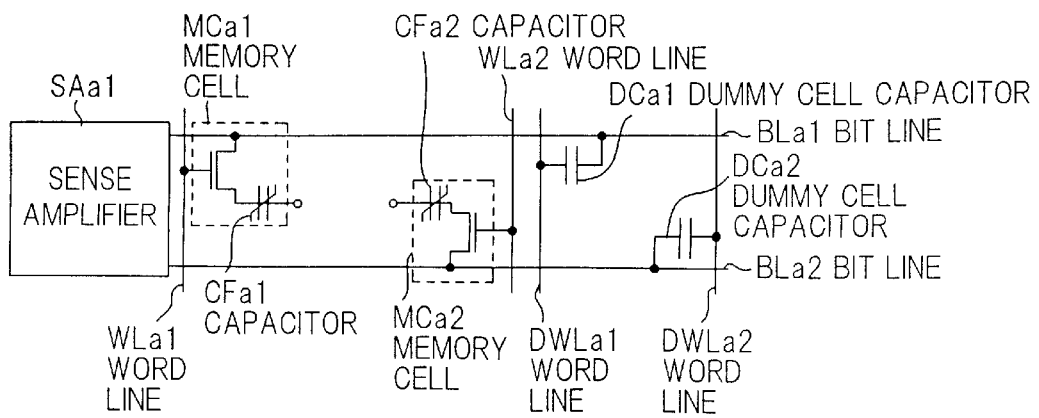
FIG. 3 is a circuit diagram for explaining a conventional method for generating a reference voltage.

Moreover, in the second dummy cell shown in FIG. 2, in which the capacitor sizes are different between the dummy cell capacitor and the memory cell, the capacitance of the memory cell capacitor is previously estimated, thereafter the capacitance of the dummy cell is estimated in both cases that the polarization of the dummy cell is inverted and not inverted, and the capacitor size of the dummy cell is determined based on the aforementioned estimations, so that it is difficult to design the capacitor size of the dummy cell. In the case of third dummy cell shown in FIG. 3, in which a capacitor comprising ordinary dielectric material is used as a dummy cell, a similar problem occurs also.

Figure 4:
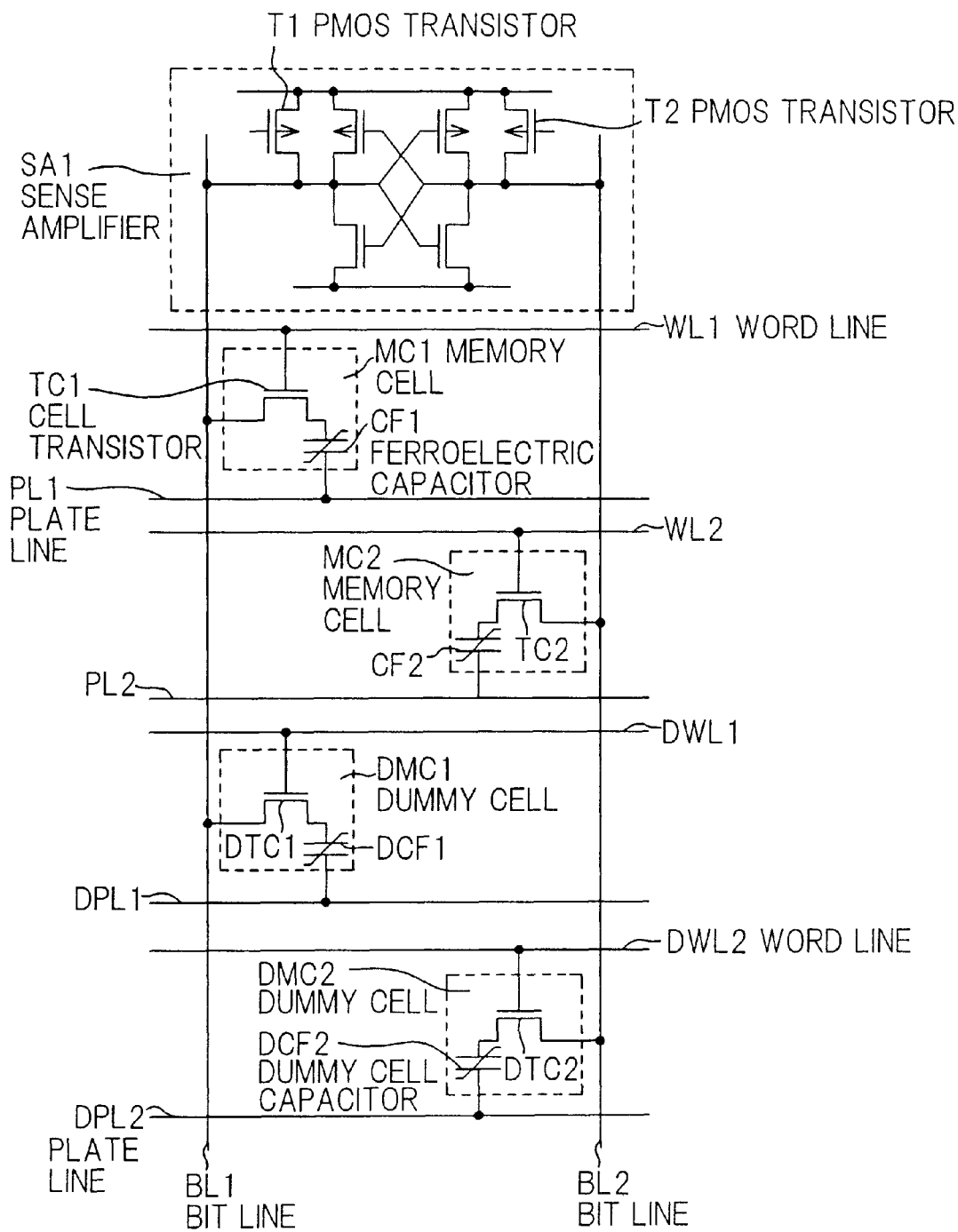
FIG. 4 is a circuit diagram for showing a ferroelectric memory device as the first preferred embodiment of the invention.

Next, the embodiment of the invention will be explained. FIG. 4 shows the first preferred embodiment of the invention, which is a fundamental circuit structure related to a non-volatile semiconductor memory device according to the invention. At ends of two neighboring bit lines BL1 and BL2, a sense amplifier SA1, which detects a datum by amplifying a voltage difference between both the bit lines, are connected with their ends. In order to intentionally make the sense amplifier SA1 be unbalanced and generate offset therein, PMOS transistors T1 and T2 are connected in parallel with PMOS transistors of a conventional latch type sense amplifier. The widths W of the channels of PMOS transistors T1 and T2 are so selected that a slight offset is introduced into the sense amplifier SA1 and an apparent reference voltage is slightly higher than a voltage read on the bit line in case that the polarization of a dummy cell is not inverted as shown in FIG. 8.

A memory cell MC1 is composed of a ferroelectric capacitor CF1 and a cell transistor TC1. A terminal of the ferroelectric capacitor CF1 is connected with a plate line PL1, and the other terminal thereof is connected with one of source and drain terminals of the cell transistor TC1. The other terminal in the source and drain terminals of the cell transistor TC1 is connected with the bit line BL1, and a gate terminal is connected with a word line WL1. The other memory cell MC2 and dummy cells DMC1 and DMC2 have the same circuit structures as that of the memory cell MC1, and the sizes of the structural elements are the same as those of the memory cell MC1.

Next, the operation of the circuit shown in FIG. 4 for reading data stored in a memory cell will be explained. In the dummy cell capacitors DCF1 and DCF2, the directions of the polarizations are previously set so that the polarizations are not inverted in case data stored therein are read. First, the bit lines BL1 and BL2 are pre-charged at the ground voltage. Next, the memory MC1 is selected by applying "H" level to the word line WL1, and a datum of the memory cell MC1 is read on the bit line BL1 by applying "H" level to the plate line PL1. In order to generate a reference voltage, a dummy cell DMC2 is selected by applying "H" level to the word line DWL2, and a charge, which corresponds to case that the polarization is not inverted, is read on the bit line BL2 by applying "H" level to the plate line DPL2. Then, the PMOS transistor T1 is made to be off and the transistor T2 is made to be on in order to make the sense amplifier SA1 be unbalanced, and the sense amplifier SA1 is activated.

Figure 6A:
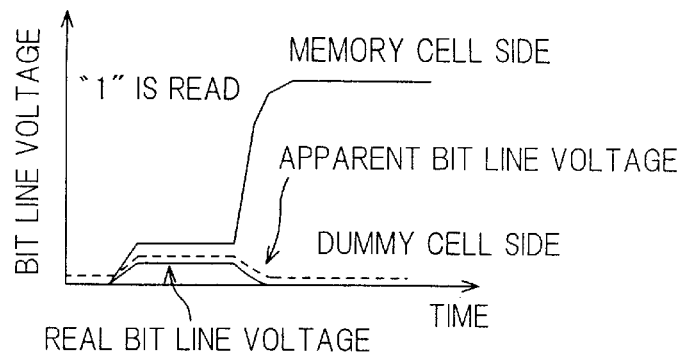
FIG. 6A shows behaviors of voltages of bit lines of the ferroelectric memory device in the time domain, when a datum stored in a memory cell is read.
Figure 6B:
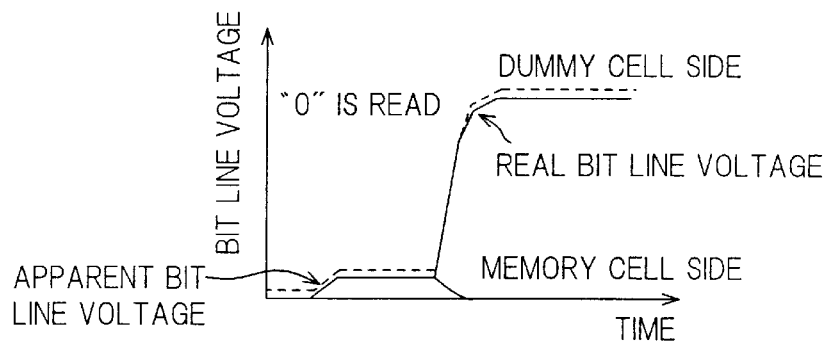
FIG. 6B shows behaviors of voltages of bit lines of the ferroelectric memory device in the time domain, when a datum stored in a memory cell is read.

In this way, the reference voltage is apparently higher than a voltage read on the bit line connected with the memory cell, the polarization of which is not inverted, and lower than a voltage read on the bit line connected with the memory cell, the polarization of which is inverted, as shown in FIG. 8. Then, the voltages of the bit lines BL1 and BL2 will be considered. In case that the polarization of the memory cell is inverted, the bit line on the memory cell side is at high level and the bit line on the dummy cell side is at low level as shown in FIG. 6A. In case that the polarization of the memory cell is not inverted, the bit line on the memory cell side is at low level, and the bas sine on the dummy cell side is at high level as shown in FIG. 6B. Accordingly a datum in the memory cell MC1 can be exactly read. Moreover, since the polarization of the dummy cell is not inverted in case that the datum stored in the dummy cell is read, the problem of dielectric fatigue, which occurs in case that the polarization is repeatedly inverted, in other words, the uncertainty of the reference voltage, which is caused by the difference in the number of access between the memory cell and the dummy cell, is out of the question.

Figure 5:
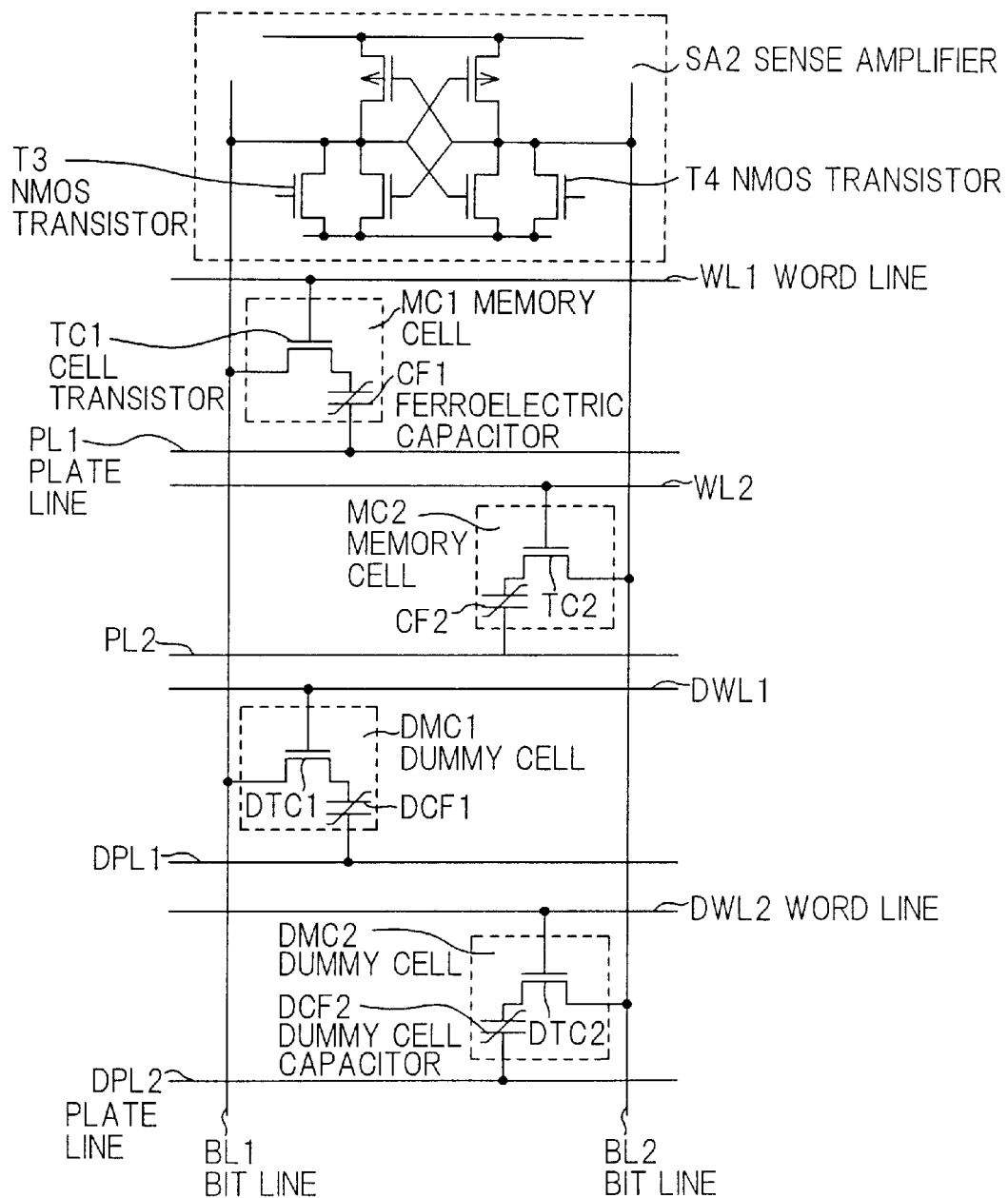
FIG. 5 is a circuit diagram for showing a ferroelectric memory device as the second preferred embodiment of the invention.

FIG. 5 shows the second preferred embodiment of the invention. The structures of the memory cell and the dummy cell are the same as those shown in the first preferred embodiment. A sense amplifier SA2 is set at the ends of bit lines BL1 and BL2, and NMOS transistors T3 and T4 are connected in parallel with NMOS transistors of the conventional latch type sense amplifier.

Next, the operation of the circuit shown in FIG. 5 for reading a datum stored in the memory cell will be explained. Similarly to the case of the first preferred embodiment, the directions of the polarizations of the dummy cells DMC1 and DMC2 are previously set so that the polarizations are not inverted in case that data stored therein are read. Then, the bit lines BL1 and BL2 are pre-charged at the ground voltage. Next, a memory cell MC1 is selected by applying "H" level to the word line WL1, and a datum in the memory cell MC1 is read on the bit line BL1 by applying "H" level to a plate line PL1. In order to generate a reference voltage, a dummy cell DMC2 is selected by applying "H" level to a word line DWL2, and a charge, which corresponds to case that the polarization of the dummy cell DMC2 is not inverted, is read on the bit line BL2 by applying "H" level to a plate line DPL2. Thereafter, an NMOS transistor T3 is made to be on and an NMOS transistor T4 is made to be off in order to make the sense amplifier SA2 be unbalanced, and the sense amplifier SA2 is activated. Accordingly, the apparent voltage of the bit line BL2 is higher than a voltage read on the bit line BL1 in case that the polarization of the memory is not inverted, and lower than the voltage read on the bit line BL1 in case that the polarization of the memory cell is inverted, so that a datum in the memory cell can be exactly read. Moreover, similarly to the case of the first preferred embodiment, since the polarization of the dummy cell is not inverted in case that the datum stored therein is read, the uncertainty of the reference voltage, which is caused by the difference in the number of access between the memory cell and the dummy cell, is out of the question.

As mentioned in the above, according to the invention, since the polarization of the dummy cell is not inverted in case that the datum stored therein is read, dielectric fatigue of the dummy cell capacitor can be suppressed, and the uncertainty of the reference voltage, which is caused by the difference in the number of access between the memory cell and the dummy cell, can be eliminated. Moreover, since the capacitor size of the dummy cell is equal to that of the memory cell, the design of the capacitor size can be simplified.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is that:

1. A ferroelectric memory device composed of plural pairs of bit lines adjacent to each other, each of which comprising:

plural memory cells connected with said respective bit lines, each of said memory cells being composed of a ferroelectric capacitor and a MOS transistor, wherein a direction of a polarization of ferroelectric material of said ferroelectric capacitor corresponds to a datum stored in said memory cell, two dummy cells respectively connected with said bit lines, each of said dummy cells having a same structure and a same ferroelectric capacitor as those of said memory cell, wherein a direction of a polarization of ferroelectric material of a ferroelectric capacitor of said dummy cell is set so that it is not inverted in case that a datum stored in said dummy cell is read, and a sense amplifier, which is connected with said bit lines, provided with means for generating offset therein by intentionally making it be unbalanced, and reads said datum stored in said memory cell with reference to a voltage generated by said offset and a signal voltage read from said dummy cell.

2. The ferroelectric memory device as defined in claim 1, wherein:

said means for generating offset comprises two MOS transistors, which are respectively connected with circuit elements of said sense amplifier being in series with said respective bit lines, and one of them is made to be on in case that said datum stored in said dummy cell is read.

3. A ferroelectric memory device according to claim 2, wherein:

said two MOS transistors are PMOS transistors.

4. A ferroelectric memory device according to claim 2, wherein:

said two MOS transistors are NMOS transistors.

* * * * *